US009923038B2

United States Patent
Kanaya

(10) Patent No.: US 9,923,038 B2
(45) Date of Patent: Mar. 20, 2018

(54) ORGANIC EL DISPLAY DEVICE

(71) Applicant: Japan Display Inc., Tokyo (JP)

(72) Inventor: Heisuke Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/383,016

(22) Filed: Dec. 19, 2016

(65) Prior Publication Data
US 2017/0179211 A1 Jun. 22, 2017

(30) Foreign Application Priority Data

Dec. 22, 2015 (JP) .................................. 2015-250369

(51) Int. Cl.
| H01L 21/00 | (2006.01) |
| H01L 33/00 | (2010.01) |
| H01L 27/32 | (2006.01) |
| H01L 51/52 | (2006.01) |

(52) U.S. Cl.
CPC ...... H01L 27/3258 (2013.01); H01L 27/3246 (2013.01); H01L 27/3248 (2013.01); H01L 51/5262 (2013.01); H01L 51/5284 (2013.01); H01L 2251/5315 (2013.01)

(58) Field of Classification Search
CPC .................. H01L 27/3248; H01L 27/3258
USPC ............... 438/31, 39–44; 257/83, 93, 98
See application file for complete search history.

(56) References Cited

U.S. PATENT DOCUMENTS

| 6,614,174 | B1 | 9/2003 | Urabe et al. |
| 6,969,291 | B2 | 11/2005 | Urabe et al. |
| 7,733,015 | B2 * | 6/2010 | Saito ................... H01L 27/1248 313/506 |
| 8,400,187 | B2 * | 3/2013 | Yamazaki ........... H01L 27/1225 326/102 |
| 8,569,761 | B2 | 10/2013 | Jo et al. |
| 9,698,164 | B2 * | 7/2017 | Morosawa .......... H01L 27/1225 257/49 |

FOREIGN PATENT DOCUMENTS

| JP | 2001-148291 A | 5/2001 |
| JP | 2012-23028 A | 2/2012 |

* cited by examiner

Primary Examiner — Calvin Lee
(74) Attorney, Agent, or Firm — Typha IP LLC

(57) ABSTRACT

Provided is a display device including a pixel. The pixel has: a conductive film; an interlayer insulating film over the conductive film; a first electrode over the interlayer insulating film; an insulating film over the first electrode; an organic layer over the first electrode and the insulating film; and a second electrode over the organic layer. The interlayer insulating film has a first opening portion overlapping with the conductive film. The insulating film covers the first opening portion. A first region of the organic layer in contact with the first electrode surrounds the insulating film. An area defined by a periphery of the first region has at least two symmetry axes in a direction parallel to a surface of the substrate.

18 Claims, 12 Drawing Sheets

400

410

ORGANIC EL DISPLAY DEVICE

CROSS REFERENCE TO RELATED APPLICATIONS

This application is based on and claims the benefit of priority from the prior Japanese Patent Application No. 2015-250369, filed on Dec. 22, 2015, the entire contents of which are incorporated herein by reference.

FIELD

The present invention relates to a display device. For example, the present invention relates to an organic EL display device having a light-emitting element including an electroluminescent layer.

BACKGROUND

A display device having a plurality of pixels formed over a substrate has been known. As a typical example of such a display device, a liquid crystal display device (LCD), an electroluminescence display device (EL display device), and the like are represented.

An EL display device is a display device having a light-emitting element in each pixel where the light-emitting element has a structure in which a material exhibiting an electroluminescence (EL) phenomenon is sandwiched between a pair of electrodes. A light-emitting element using an organic compound as a material is called an organic EL element or an organic electroluminescence element and also called an organic light-emitting element diode (OLED) element due to its diode characteristics. A display device having a plurality of such light-emitting elements is called an organic EL display device. Since organic compounds are able to exhibit a variety of emission wavelengths due to their design diversity, colors with a variety of wavelengths can be obtained by appropriately selecting organic compounds. Furthermore, an organic EL display element has an excellent response property and is capable of giving an image with high contrast.

Generally, each pixel includes a light-emitting element and a driving transistor for supplying a current to drive the light-emitting element. After the driving transistor is formed over a substrate, the driving transistor is covered with an insulating film constructed with an organic resin material and the like over which the light-emitting element is formed. An electrical connection between the light-emitting element and the driving transistor is performed through an opening portion (contact hole) formed in the insulating film. As a typical example of such a structure, a display device with a structure disclosed in Japanese patent application publications No. 2001-148291 and 2012-23028 has been known.

SUMMARY

When an organic EL display device is used in a mobile electronic device such as a mobile telephone or a mobile game machine, it is considered that a screen of a display device is arranged at a variety of angles with respect to a user. Furthermore, a direction of the screen to a user is freely selected, and a user may hold the display device vertically or horizontally or lean the display device during usage. Therefore, it is important that display quality such as color balance of an image do not vary even if a viewing angle or an arrangement angle of a screen is changed. When an image is not displayed, light reflected at a screen is recognized as a color of the screen. In view of designability, it is preferred that the color of the screen do not change with the change of an arrangement angle or an angle to a user even when an image is not displayed.

A display device according to an embodiment of the present invention includes a substrate and a pixel over the substrate. The pixel includes: a conductive film; an interlayer insulating film over the conductive film; a first electrode over the interlayer insulating film; an insulating film over the first electrode; an organic layer over the first electrode and the insulating film; and a second electrode over the organic layer. The interlayer insulating film has a first opening portion overlapping with the conductive film. The first electrode is electrically connected to the conductive film in the first opening portion. The insulating film covers the first opening portion. A first region of the organic layer in contact with the first electrode surrounds the insulating film. An area defined by a periphery of the first region has at least two symmetry axes in a direction parallel to a surface of the substrate.

A display device according to an embodiment of the present invention includes a substrate and a pixel over the substrate. The pixel includes: a transistor; an interlayer insulating film over the transistor; a first electrode over the interlayer insulating film; an insulating film over the first electrode; an organic layer over the first electrode and the insulating film; and a second electrode over the organic layer. The interlayer insulating film has a first opening portion. The first electrode is electrically connected to the transistor in the first opening portion. The insulating film covers the first opening portion. A first region of the organic layer in contact with the first electrode surrounds the insulating film. An area defined by a periphery of the first region has at least two symmetry axes in a direction parallel to a surface of the substrate.

An embodiment of the present invention is a manufacturing method of a display device. The manufacturing method includes the steps of: forming a conductive film over a substrate; forming an interlayer insulating film over the conductive film; forming a first opening portion in the interlayer insulating film so as to expose the conductive film; forming a first electrode over the interlayer insulating film, the first electrode being electrically connected to the conductive film; forming an insulating film over the first electrode, the insulating film covering the first opening portion; forming an organic layer over the insulating film; and forming a second electrode over the organic layer. The organic layer is formed so that a first region of the organic layer in contact with the first electrode surrounds the insulating film, and an area defined by a periphery of the first region has at least two symmetry axes in a direction parallel to a surface of the substrate.

DESCRIPTION OF EMBODIMENTS

Figure 1:
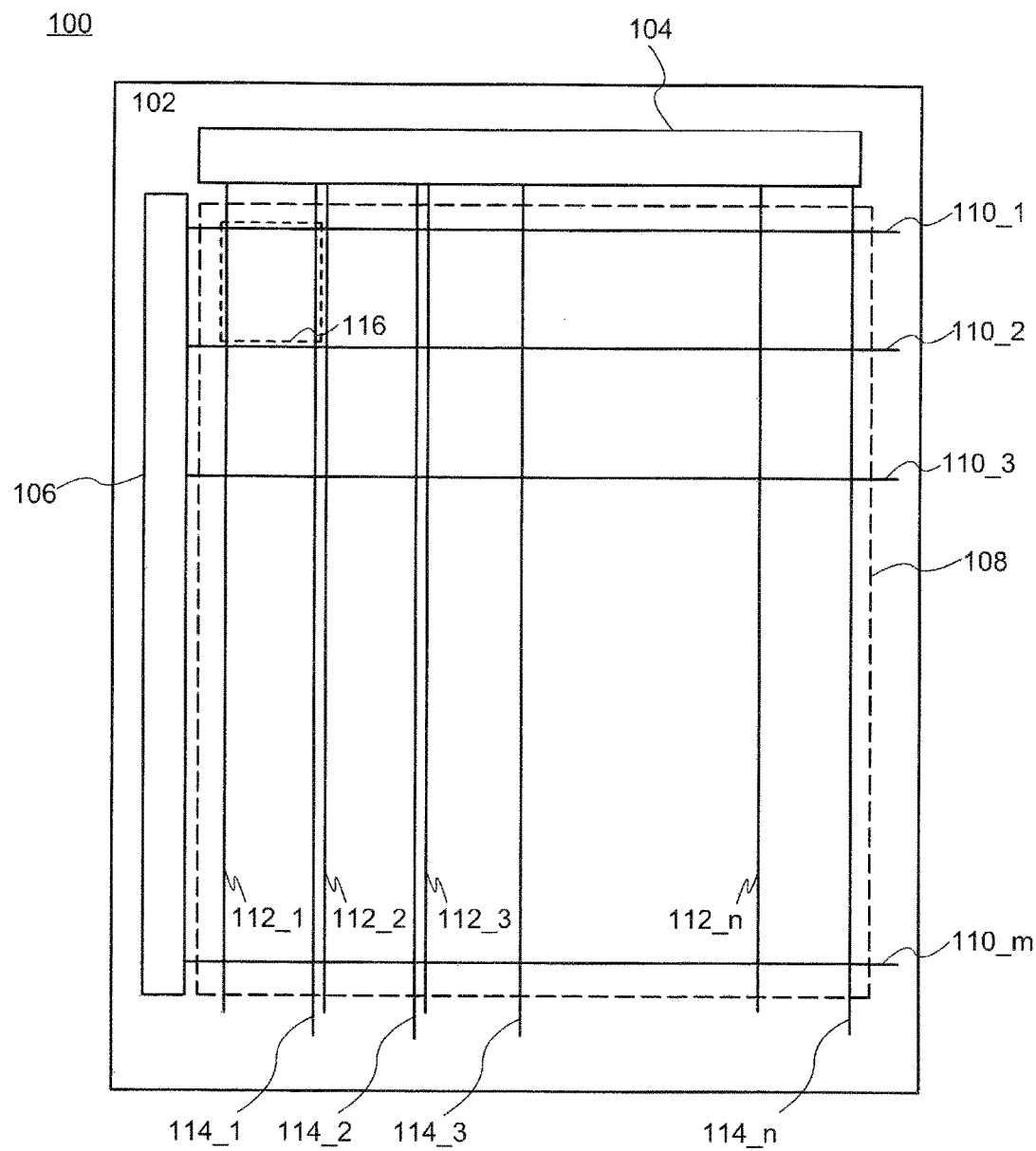
FIG. 1 is a drawing showing a structure of a display device of an embodiment of the present invention.

Hereinafter, each embodiment of the present invention is explained with reference to the drawings. However, the invention can be implemented in a variety of different modes within its concept and should not be interpreted as being limited to the disclosure of the following embodiments.

In the drawings, the width, thickness, shape, and the like of each component may be schematically illustrated and different from those of an actual mode in order to provide a clearer explanation. However, the drawings simply give an example and do not limit the interpretation of the present invention. In the specification and each of the drawings, the same reference number is provided to an element which is the same as that appearing in preceding drawings, and a detailed explanation may be omitted as appropriate.

First Embodiment

1. Structure of Display Device

FIG. 1 is a top view of a display device 100 of the First Embodiment. As shown in FIG. 1, the display device 100 has a display region 108, a source side driver circuit 104, and a gate side driver circuit 106 formed over a substrate 210. In the present embodiment, a display device having the source side driver circuit 104 and the gate side driver circuit 106 over the substrate 210 is shown. However, both or one of the source side driver circuit 104 and the gate side driver circuit 106 may be formed as a driver IC over another substrate. The source side driver circuit 104 and the gate side driver circuit 106 provide a variety of signals for controlling the display region 108.

A plurality of pixels 116 is arranged in a matrix form in the display region 108. In FIG. 1, the pixels 116 are arranged in a matrix form with m rows and n columns. A light-emitting element and one or more switching elements such as a transistor are provided in each pixel 116. Note that the switching element is not limited to a transistor, and any kind of element having a current-controlling function can be used. Hereinafter, an example is described in which a transistor is used as a switching element.

On/off of the transistor in each pixel 116 is carried out by gate signals provided from the gate side driver circuit 106 through gate lines 110_1 to 110_m. Data signals corresponding to image data are transmitted from the source side driver circuit 104 through the data lines 112_1 to 112_n. Furthermore, current is supplied to the light-emitting elements from the source side driver circuit 104 through current-supplying lines 114_1 to 114_n. Display corresponding to the image data can be performed by providing the data signals to the light-emitting element through the transistor disposed in each pixel 116. The transistor may be any of an N-channel type and a P-channel type. In the present embodiment, explanation is given for the case where the transistors used in the display region 108 are N-channel type transistors and transistors used in the source side driver circuit 104 and the gate side driver circuit 106 are P-channel type transistors.

Figure 2A:
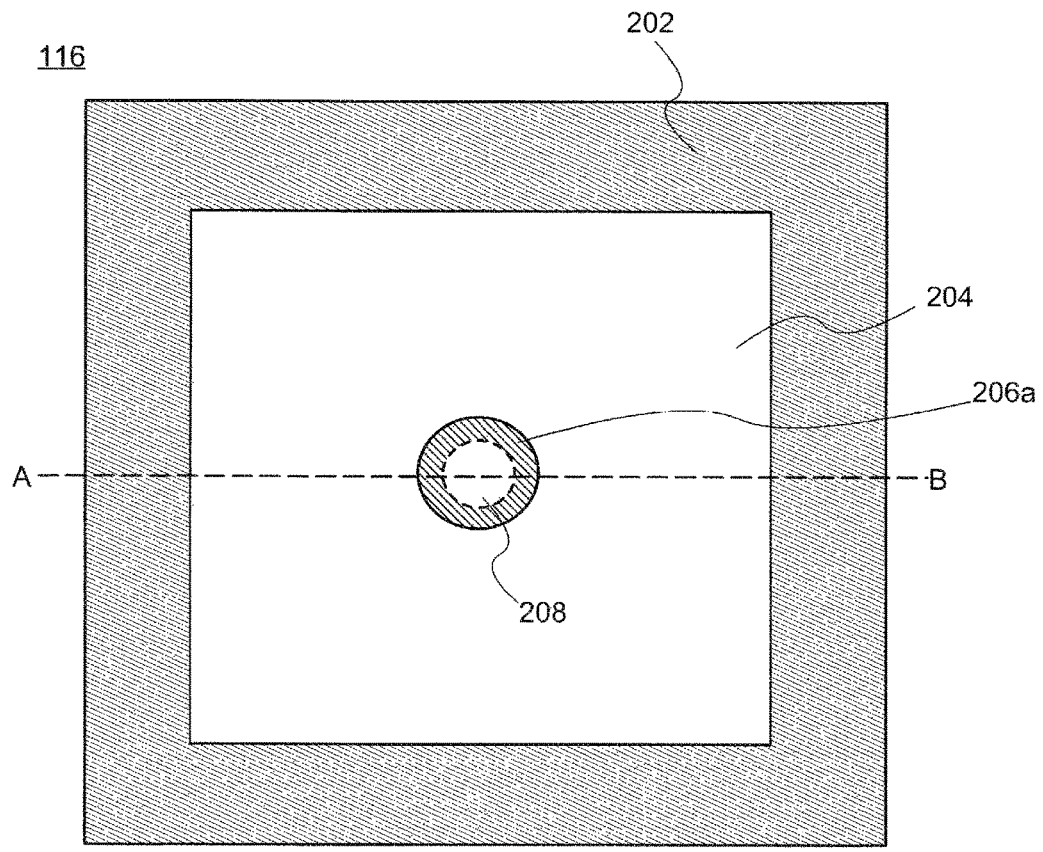
FIG. 2A and FIG. 2B are respectively a top view and a cross-sectional view of a pixel of a display device of an embodiment of the present invention.
Figure 2B:
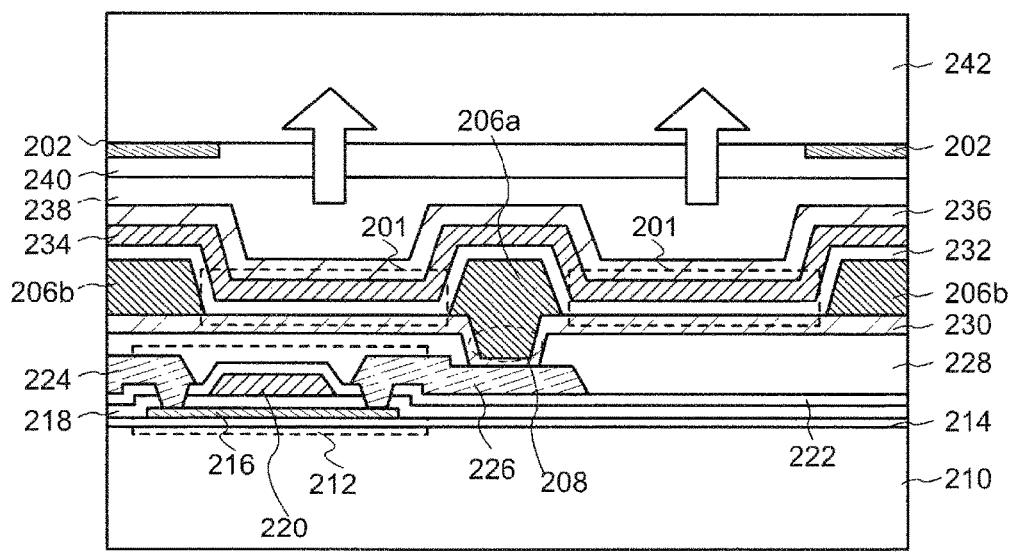

FIG. 2A and FIG. 2B are drawings showing the structure of the pixel 116 of the display device 100 of the First Embodiment. FIG. 2A is a top view of the pixel 116, and a cross-section along the dotted line A-B is shown in FIG. 2B.

As shown in FIG. 2B, the pixel 116 has the light-emitting element 201 and at least one or more transistors 212. The transistor 212 shown in FIG. 2B functions as a driving transistor for supplying current to the light-emitting element 201. The transistor 212 is formed over the substrate 210 with a base film 214 interposed therebetween and sequentially possesses a semiconductor layer 216, a gate insulating film 218, a gate electrode 220, a protection film 222, and source/drain electrodes 224/226 from a side of the substrate 210. In the present embodiment, explanation is given for the case where the source electrode and the drain electrode are 224 and 226, respectively, for convenience. However, the embodiment is not limited thereto, and it is possible to recognize the source electrode and the drain electrode as 226 and 224, respectively, depending on the direction of current and the like. Note that description is made in the present embodiment for the case where the transistor 212 is a top-gate type. However, the transistor 212 may be a bottom-gate type or a type having both bottom gate and top gate.

An interlayer insulating film 228 is formed over the transistor 212. The interlayer insulating film 228 is provided in order to protect the transistor 212 and also to give a flat surface by absorbing projections and depressions caused by the transistor 212.

Figure 3A:
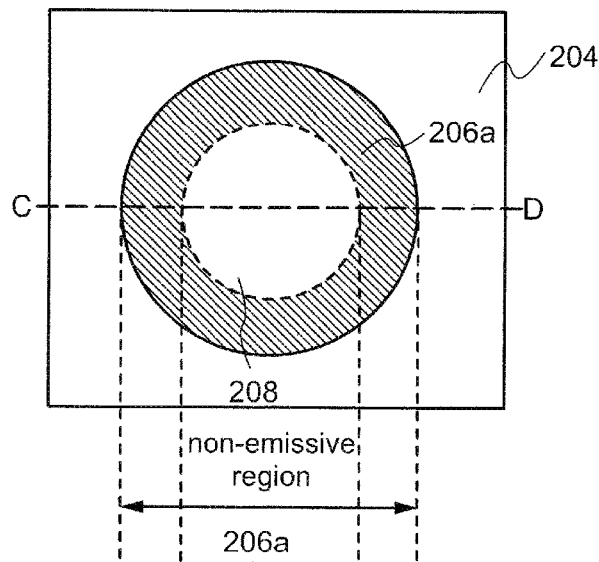
FIG. 3A and FIG. 3B are respectively a top view and a cross-sectional view of a pixel of a display device of an embodiment of the present invention.
Figure 3B:
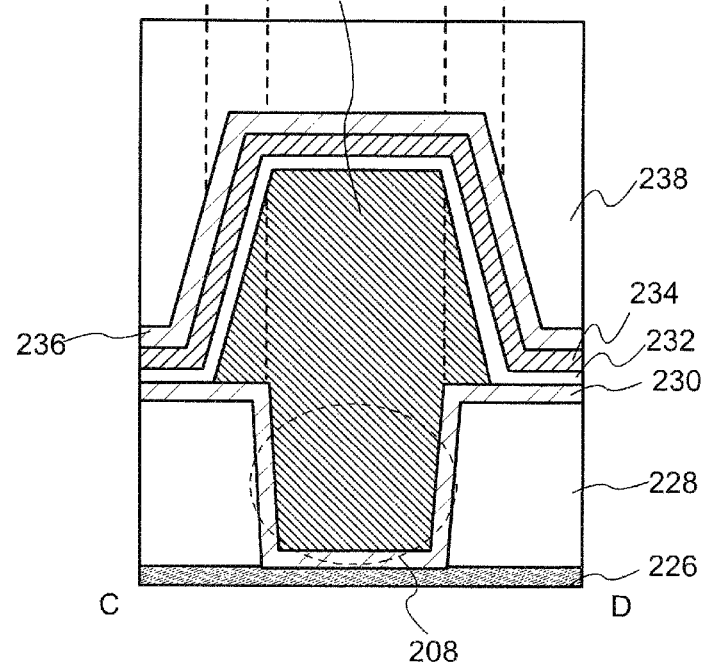

An opening portion (first opening portion) 208 is formed in the interlayer insulating film 228. An enlarged plane view and a cross-sectional view of a central portion of the pixel are shown in FIG. 3A and FIG. 3B, respectively. A shape of the opening portion 208, that is, a shape of a cross section of the opening portion 208, which is parallel to a surface of the substrate 210, is not limited and can have a shape such as a circular shape, a square shape, and a rectangular shape. In contrast, a shape of a cross section of the opening portion 208, which is perpendicular to the surface of the substrate, is trapezoidal, and a lower base of the opening portion 208 is shorter than an upper base thereof as shown in FIG. 3B. In other words, a sidewall of the opening portion 208 is inclined from the surface of the substrate 210.

In the present embodiment, an example is shown in which the interlayer insulating film 228 has one opening portion. However, the embodiment is not limited thereto, and a plurality of opening portions 208 may be provided.

A first electrode 230 of the light-emitting element 201 is disposed over the interlayer insulating film 228 and is electrically connected to a conductive film, which is a drain electrode 226, in the opening portion 208. Therefore, the opening portion 208 functions as a so-called contact hole. In the present embodiment, explanation is given for a case where the first electrode 230 is an anode. However, the embodiment is not limited thereto, and a cathode may be formed as the first electrode 230.

As shown in FIG. 2B and FIG. 3B, the pixel 116 possesses insulating films 206a and 206b over the first electrode 230. The insulating film 206a is formed so as to cover the opening portion 208, and a depression caused by the opening portion 208 is filled with the insulating film 206a. Furthermore, the insulating film 206a protrudes in a direction parallel to the surface of the substrate and a direction perpendicular to the surface of the substrate. Specifically, as shown in FIG. 3B, a portion of the surface of the first electrode 230, which is parallel to the substrate 210, is partly covered with the insulating film 206a. As described above, there is no limitation to a shape of the insulating film 206a, that is, a shape of a cross section of the insulating film 206a, which is parallel to the substrate 210, and the cross section may have a shape such as a circular shape, a square shape, and a rectangular shape. A case where both of the opening portion 208 and the insulating film 206a have a circular shape is shown in FIG. 2A and FIG. 3A. A side surface of the insulating film 206a is inclined from the surface of the substrate 210. Namely, an angle between the side surface of the insulating film 206a and the surface of the substrate 210 is larger than 0° and smaller than 90°. As shown in FIG. 3A, in a portion over the first electrode 230, the cross section of the insulating film 206a, which is parallel to the substrate 210, becomes smaller as a distance from the substrate 210 increases.

The insulating film 206b is a partition wall (bank) formed at a peripheral portion (edge portion) of the first electrode 230, surrounds the first electrode 230, and electrically separates the adjacent pixels. Similar to the insulating film 206a, a side surface of the insulating film 206b is inclined, and a cross section parallel to the substrate 210 becomes smaller as a distance from the substrate 210 increases.

The pixel 116 further has an organic layer 232 over the first electrode 230 and the insulating films 206a and 206b. Furthermore, a second electrode 234 is formed over the organic layer 232, and a protection film 236 is provided over the second electrode 234. Note that, when the first electrode 230 is a cathode, the second electrode 234 functions as an anode. The light-emitting element 201 is structured with the first electrode 230, the organic layer 232, and the second electrode 234.

The display device 100 further includes an opposing substrate 242, and a light-shielding film (black matrix) 202 is disposed over the opposing substrate 242 (so as to be sandwiched between the opposing substrate 242 and the substrate 210 in the case of FIG. 2B). The opposing substrate 242 and the light-shielding film 202 are bonded to the substrate 210 with a filler (filling material) 238 interposed therebetween. As shown in FIG. 2A and FIG. 2B, the light-shielding film 202 is disposed at an edge portion of the pixel 116 so as to overlap with the insulating film 206b. In other words, the light-shielding film 202 has an opening portion (second opening portion) overlapping with the light-emitting element 201, and almost all of the light-shielding film 202 other than the opening portion overlaps with the insulating film 206b. It is preferred that the opening portion of the light-shielding film 202 be square or rectangular. The formation of the light-shielding film in such a shape improves its processability and decreases variation in shape of the light-shielding film 202. Additionally, a distance between the adjacent pixels can be decreased, and a display device with higher resolution can be manufactured.

The display device 100 further possesses a protection film (overcoat) 240 covering the opposing substrate 242 and the light-shielding film 202.

Here, electrons and holes are respectively injected from the first electrode 230 and the second electrode 234 into a region of the organic layer 232, which is surrounded by the insulating film 260b dividing the adjacent pixels and which is in contact with the first electrode 230, and light-emission is obtained via recombination of the holes and electrons. That is, this region is an emission region and indicated as 204 in FIG. 2A and FIG. 3A. Therefore, when the first electrode 230 reflects visible light and the second electrode 234 transmits visible light, light-emission occurs as indicated by the arrow in FIG. 2B. On the other hand, in a region of the organic layer 232, which is not in contact with the first electrode 230, since current hardly flows due to the presence of the insulating film 206a or 206b between the first electrode 230 and the organic layer 232, no emission can be substantially obtained. Namely, this region is a non-emission region. For example, as shown in FIG. 3B, a portion in which the organic layer 232 overlaps with the insulating film 206a is a non-emission region.

Figure 8A:
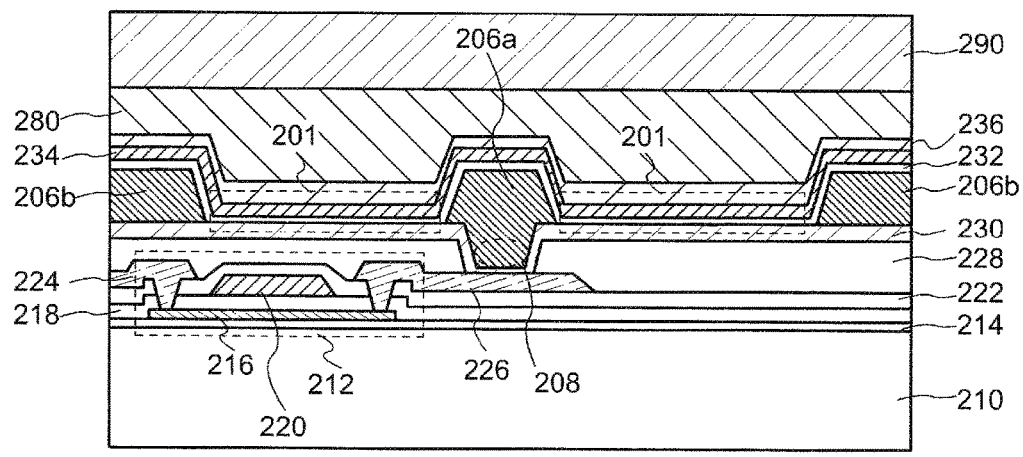
FIG. 8A and FIG. 8B are each a cross-sectional view of a pixel of a display device of an embodiment of the present invention.

The aforementioned display device 100 includes the filler 238 and the opposing substrate 242 over the protection film 236. However, an embodiment of the present invention is not limited to such a structure. For example, similar to a pixel 400 shown in FIG. 8A, a sealing film 280 and a polarizing plate 290 may be disposed over the protection film 236. The sealing film 280 is a film having a sealing function to prevent impurities such as oxygen and water from entering the light-emitting element 201. For the sealing film 280, an inorganic compound such as silicon oxide, silicon nitride, silicon oxynitride, and silicon nitride oxide or a polymer material such as an acrylic resin, a polyester, and a polyimide can be used for example. These materials may be stacked. For example, a film having a structure in which an acrylic resin is sandwiched with films of silicon nitride or silicon oxide may be used as the sealing film 280. Specifically, a structure may be employed in which silicon nitride, an acrylic resin, silicon oxide, and silicon nitride are sequentially stacked. The sealing film 280 can be formed by appropriately combining a chemical vapor deposition method (CVD method), a physical vapor deposition method such as a sputtering method and an evaporation method, a liquid-phase method such as a spin-coating method, an ink-jet method, and a printing method, a lamination method, and the like. A linear polarizing plate and a circular polarizing plate can be used as the polarizing plate 290, and the polarizing plate 290 can be formed with a lamination method and the like.

Figure 8B:
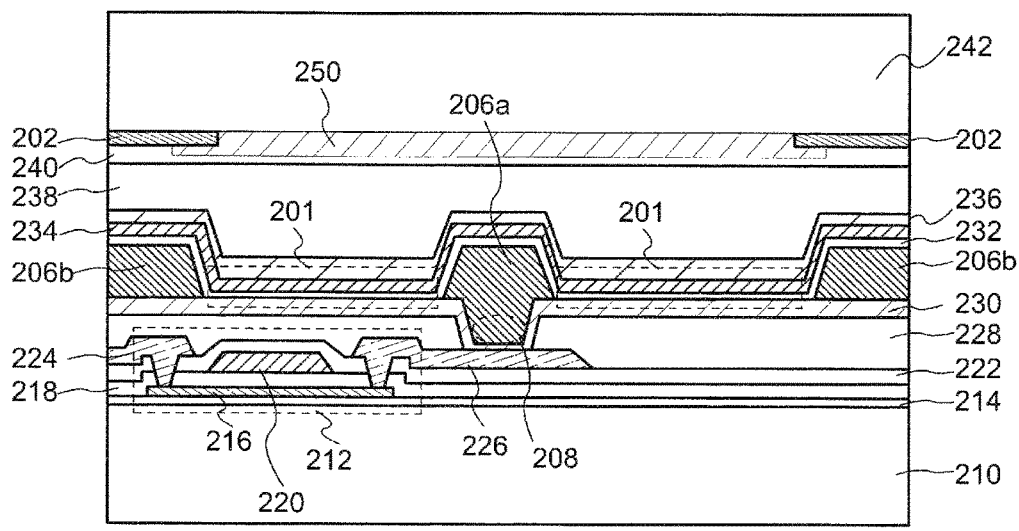

In the pixel 116 shown in FIG. 2B, light emitted from the emission region 204 is extracted outside through the protection film 240 and the opposing substrate 242. Similarly, in the pixel 400 shown in FIG. 8A, light emitted from the emission region 204 is extracted outside through the sealing film 280 and the polarizing plate 290. Since the color of the light emitted from the organic layer 232 is directly reflected in these pixels 116 and 400, the emission color can be controlled by selecting a light-emitting material used in the organic layer 232. On the other hand, in the display device 100 of an embodiment of the present invention, a color filter 250 may be provided on a side of the opposing substrate 242 such as a pixel 410 shown in FIG. 8B, by which light which passes through the color filter 250 can be selectively extracted. Therefore, it is possible to manufacture a full-color display device by forming all pixels 410 with a common organic layer (e.g., a white emissive organic layer) 232 and changing the color filter 250 in every pixel 410. Note that an insulating base film may be additionally formed between the color filter 250 and the opposing substrate 242 and between the light-shielding film 202 and the opposing substrate 242.

Figure 4:
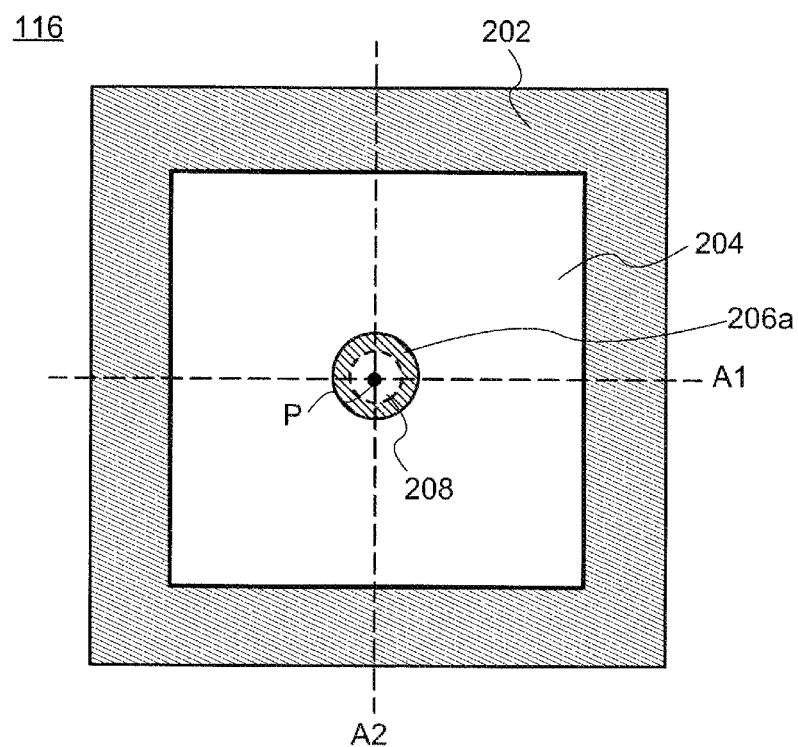
FIG. 4 is a top view of a pixel of a display device of an embodiment of the present invention.

An area defined by a periphery of the emission region 204 preferably has at least two symmetry axes which are parallel to the surface of the substrate 210. Here, in the definition of the area, the non-emission region is not considered. For example, as shown in FIG. 4, the area defined by the periphery of the emission region 204 is an area surrounded by a bold line in the drawing, and this area has symmetry axes A1 and A2 which pass through point P and which are parallel to the surface of the substrate 210. Note that the area defined by the periphery of the emission region 204 corresponds to a region surrounded by the insulating film 206b.

Figure 6A:
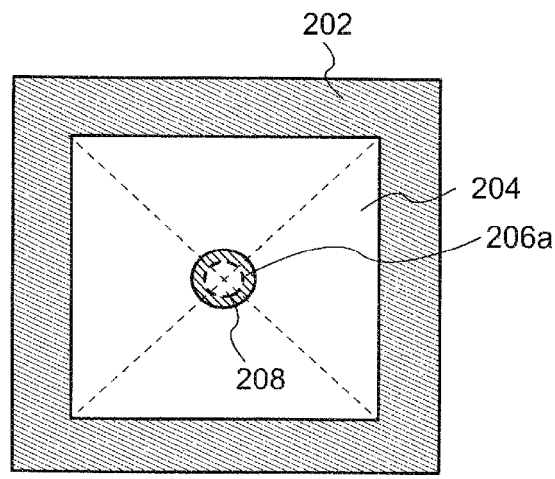
FIG. 6A to FIG. 6C are each a top view of a pixel of a display device of an embodiment of the present invention.
Figure 6B:
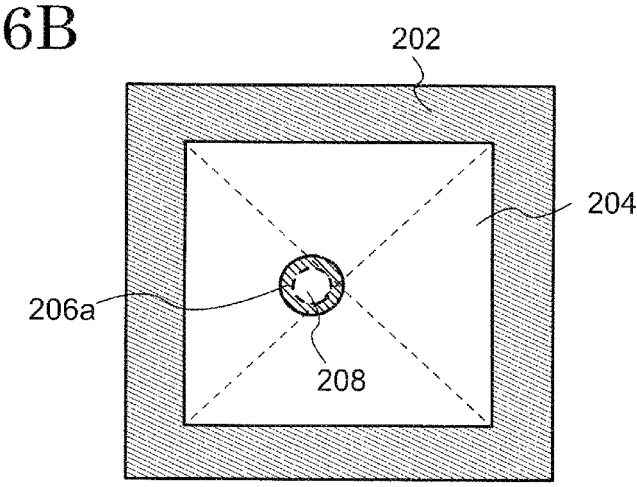

Moreover, it is preferred that a central point of the area defined by the periphery of the emission region 204 overlap with the opening portion 208 or the insulating film 206a. More specifically, as shown in FIG. 6A, it is preferred that the central point of the aforementioned area (here, a cross point of two dotted lines) overlap with the opening portion 208 formed in the insulating film 228. Alternatively, as shown in FIG. 6B, it is preferred that, in the case where the central point does not overlap with the opening portion 208, the central point overlap with the insulating film 206a.

Figure 6C:
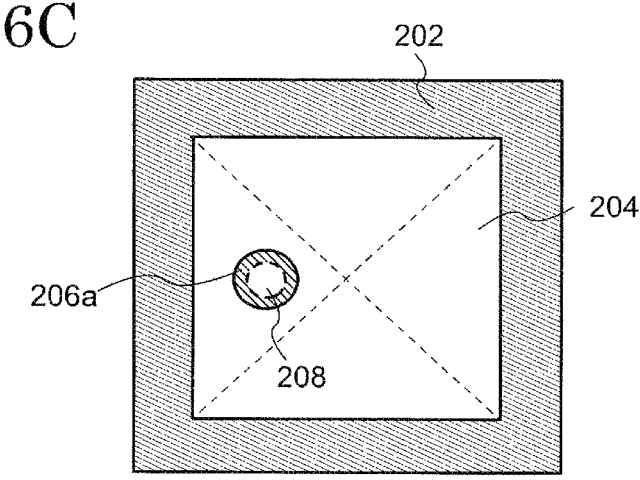
Figure 7A:
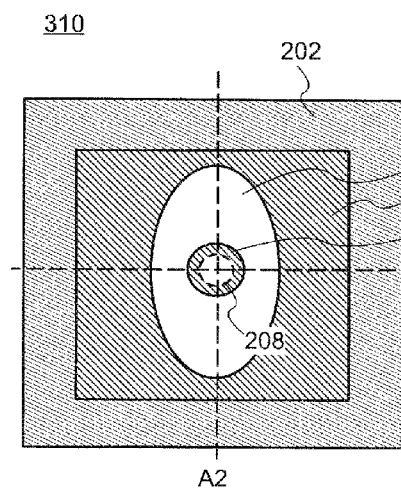
FIG. 7A to FIG. 7D are each a top view of a pixel of a display device of an embodiment of the present invention.
Figure 7B:
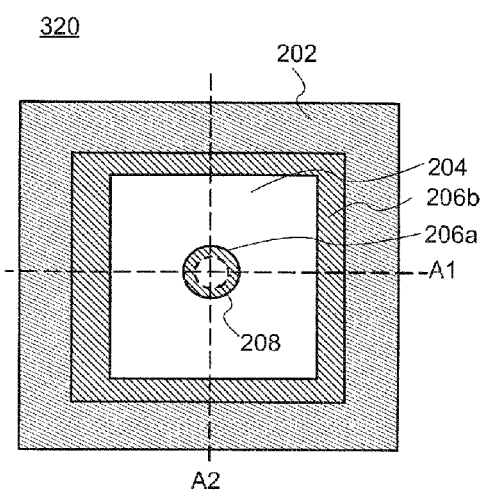
Figure 7C:
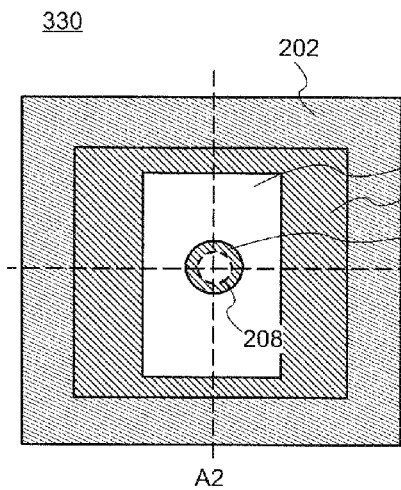
Figure 7D:
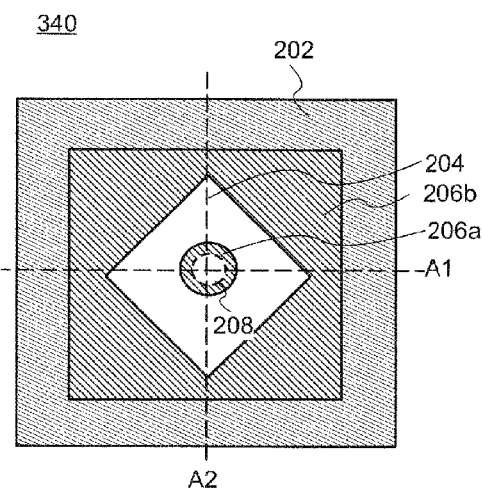

With this structure, the positional relationship between the emission region 204 and the opening portion 208 is not significantly changed even if the arrangement direction of the display device is changed to a vertical arrangement or a horizontal arrangement or the display device is placed upside down. On the contrary, as shown in FIG. 6C, when the center of the area defined by the periphery of the emission region 204 does not overlap with the opening portion 208 nor the insulating film 206a, the positional relationship between the emission region 204 and the opening portion 208 is remarkably changed depending on the arrangement direction of the display device. Therefore, the central point of the area defined by the periphery of the emission region 204 is configured so as to overlap with the opening portion 208 or the insulating film 206a, which allows supply of a display device which hardly varies or does not vary in image quality even if an arrangement direction or an angle of a screen with respect to a user is changed. Alternatively, it is possible to supply a display device which does not vary in screen color even if an image is not displayed but an arrangement direction or an angle of a screen with respect to a user is changed.

As described above, the convex insulating film 206a gives the non-emission region around the center of the emission region 204 in the pixels 116, 400, and 410 of the display device 100 of the present embodiment, in which the opening portion 208 formed in the interlayer insulating film 228 is covered with the insulating film 206a. Moreover, the sidewall of the opening portion 208 is inclined from the surface of the substrate, by which reflection of the outside light can be suppressed, background reflection at the first electrode 230 is suppressed, contrast of an image is improved, and a display device with high image quality can be supplied. In addition, since light from the emission region 204 is partly reflected by the insulation film 206a and extracted to the outside, light extraction efficiency of the light-emitting element is improved. Therefore, it is possible to provide a display device with high efficiency and low power consumption.

2. Modified Example 1 of Pixel

Figure 5A:
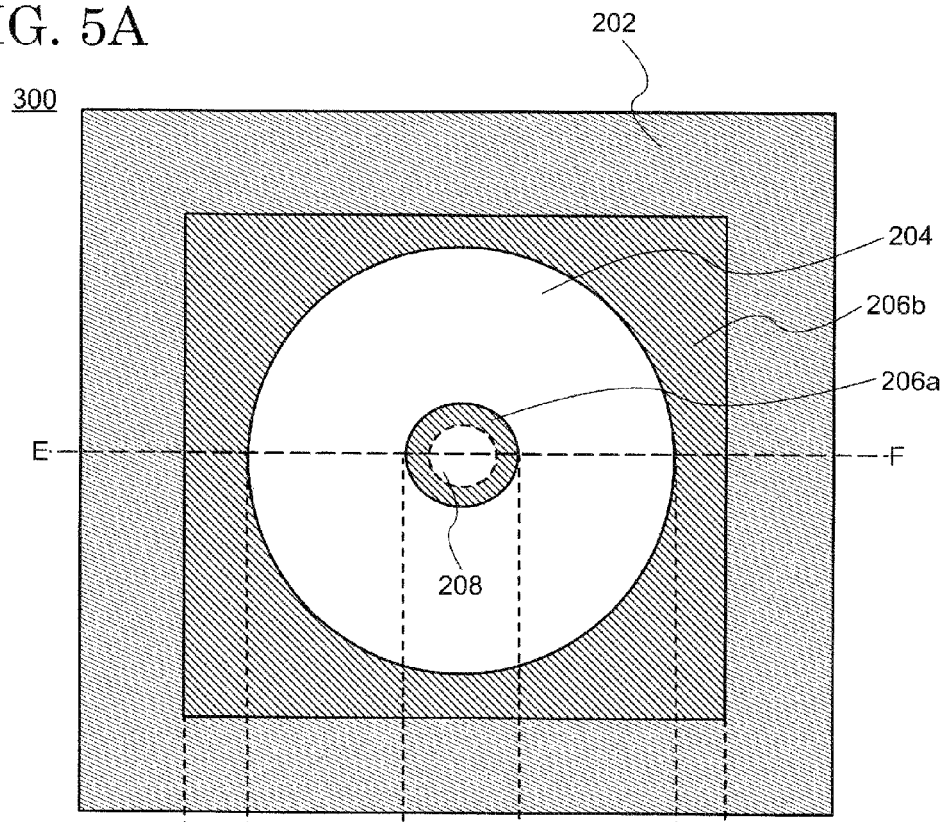
FIG. 5A and FIG. 5B are respectively a top view and a cross-sectional view of a pixel of a display device of an embodiment of the present invention.
Figure 5B:
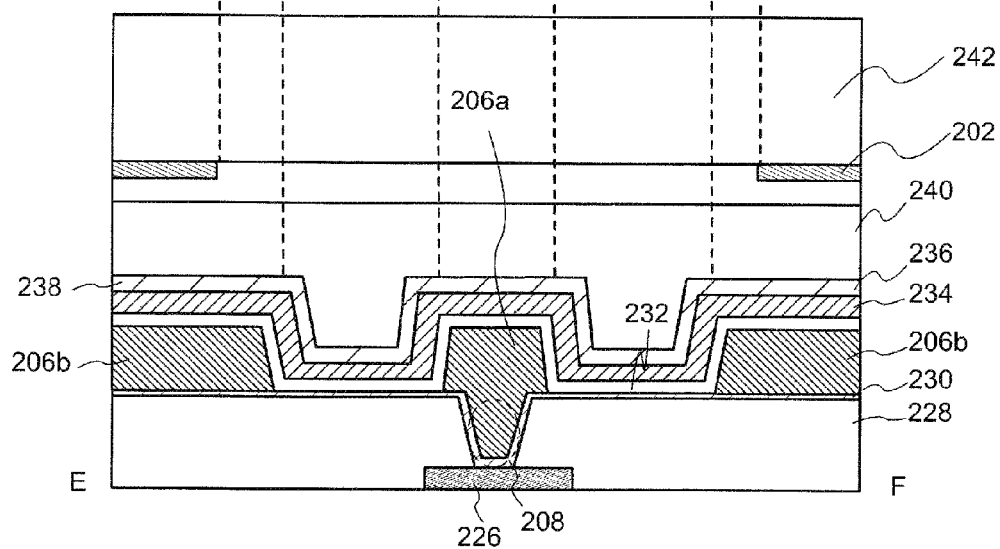

Modified examples of the pixel usable in the display device 100 of an embodiment of the present invention are shown in FIGS. 5A and 5B. FIG. 5A is a top view of a pixel 300, and FIG. 5B is a cross section along dotted line E-F. Explanation of the structures which are the same as those of the aforementioned pixel 116 is omitted.

The pixel 300 shown in FIG. 5A and FIG. 5B is different in structure of the insulating film 206b from that of the pixel 116. Specifically, a part of the insulating film 206b overlaps with the opening portion of the light-shielding film 202, and the pixel 300 has the emission region 204 with a circular shape. The pixel 300 also has the opening portion 208 and the insulating film 206a covering the opening portion 208 in the center of the circular emission region 204. In this case, there are an infinite number of symmetry axes of the area defined by the periphery of the emission region 204, which are parallel to the surface of the substrate 210.

Other modified examples of the pixel are shown in FIG. 7A to FIG. 7D. In a pixel 310 of FIG. 7A, the insulating film 206b overlaps with the opening portion of the light-shielding film 202 and is formed so as to provide an elliptical emission region 204. In a pixel 320 of FIG. 7B, the insulating film 206b overlaps with the opening portion of the light-shielding film 202 and is formed to provide a square emission region 204. In a pixel 330 of FIG. 7C, the insulating film 206b overlaps with the opening portion of the light-shielding film 202 and is formed to provide a rectangular emission region 204. In a pixel 340 of FIG. 7D, the insulating film 206b overlaps with the opening portion of the light-shielding film 202 and is formed to provide a diamond-shaped emission region 204.

In each of the pixels 310, 320, 330, and 340 of the modified examples shown in FIG. 7A to FIG. 7D, there are at least two symmetry axes (A1 and A2) of the area defined by the periphery of the emission region 204, which are parallel to the surface of the substrate 210, as indicated by the dotted lines in the drawings. Furthermore, the centers of the areas each overlap with the opening portion 208 or the insulating film 206a, by which the aforementioned effects can be obtained.

3. Modified Example 2 of Pixel

Figure 9A:
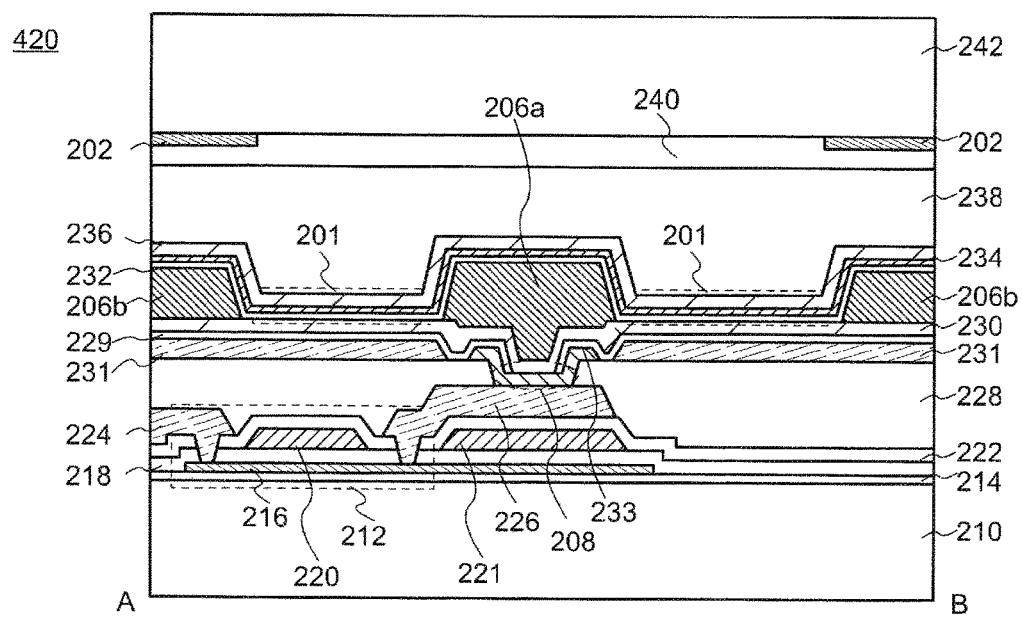
FIG. 9A and FIG. 9B are each a cross-sectional view of a pixel of a display device of an embodiment of the present invention.
Figure 9B:
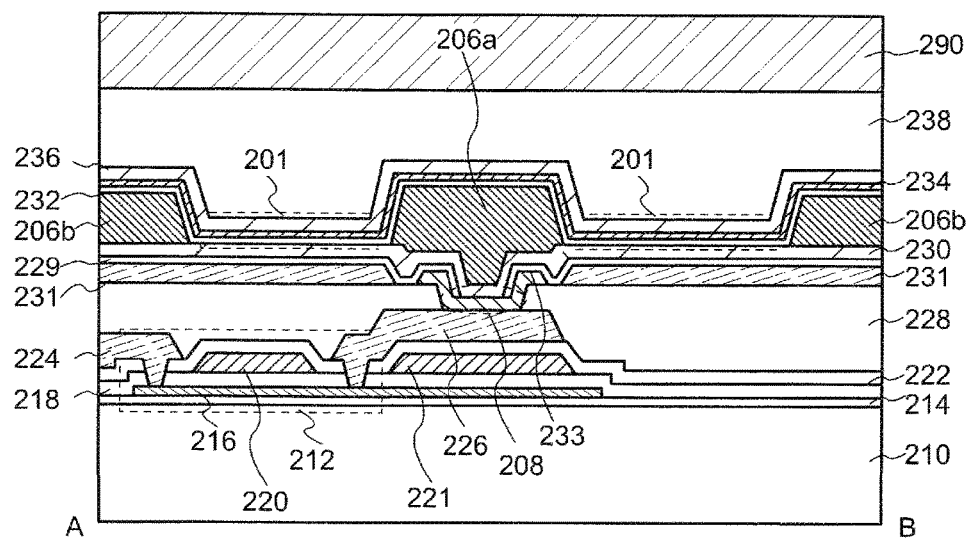

Modified examples of the pixel usable in the display device 100 of an embodiment of the present invention are shown in FIG. 9A and FIG. 9B. Explanation of the structures which are the same as those of the aforementioned pixels is omitted.

FIG. 9A is a cross-sectional view of a pixel 420 of the display device 100 of the present embodiment, and the pixel 420 has a capacitor between the transistor 212 and the light-emitting element 201. Specifically, the pixel 420 has a capacitor line 221 formed as the same layer as the gate electrode 220. Furthermore, the pixel 420 possesses a wiring 231 which is formed over the interlayer insulating film 228 with a metal or an alloy and a capacitor insulating film 229 formed over the wiring 231 with an insulator such as silicon nitride and silicon oxide. The pixel 420 further includes the first electrode 230 over the capacitor insulating film 229. The capacitor is formed with the wiring 231, the capacitor insulating film 229, and the first electrode 230.

The opening portion 208 formed in the interlayer insulating film 228 has a connection wiring 233 formed with a metal, an alloy, or a transparent conductive oxide such as indium-tin oxide (ITO) and indium-zinc oxide (IZO), and the bottom surface and the sidewall of the opening portion 208 is covered with the connection wiring 233. The capacitor insulating film 229 covers a sidewall of the connection wiring 233 and is configured so that a bottom surface of the connection wiring 233 is exposed. Hence, the connection wiring 233 is electrically connected to the first electrode 230, and the light-emitting element 201 and the transistor 202 are electrically connected via the connection wiring 233.

The pixel 410 has the insulating films 206a and 206b over the first electrode 230, the organic layer 232, and the second electrode 234 by which the light-emitting element is constructed.

Second Embodiment

In the present embodiment, a manufacturing method of the display device 100 having the pixel 116, 400, or 410 (see FIG. 2B, FIG. 8A, and FIG. 8B) shown in the First Embodiment is explained by using FIG. 10A to FIG. 11D. Note that each of the layers shown below can be formed, depending on the material, with a physical vapor deposition method such as a vacuum evaporation method and a sputtering method, a CVD method, a liquid-phase method such as an ink-jet method, a lamination method, or the like, as appropriate.

Figure 10A:
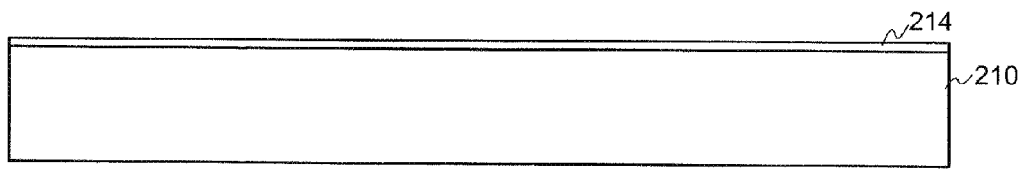
FIG. 10A to FIG. 10E are drawings showing a manufacturing method of a display device of an embodiment of the present invention.

First, the base film 214 is formed over the substrate 210 (FIG. 10A). Glass, quartz, a metal, ceramics, plastics, and the like can be used for the substrate 210. Moreover, the substrate may be flexible in order to allow the display device 100 to be bent. Typically, an insulating film structured with an inorganic insulator such as silicon oxide, silicon nitride, silicon nitride oxide, silicon oxynitride, and aluminum oxide or a stacked film thereof can be used for the base film 214. The base film 214 has a function to prevent entrance of contaminates from the substrate 210 and relax stress generated by expansion and contraction of the substrate 210.

Figure 10B:
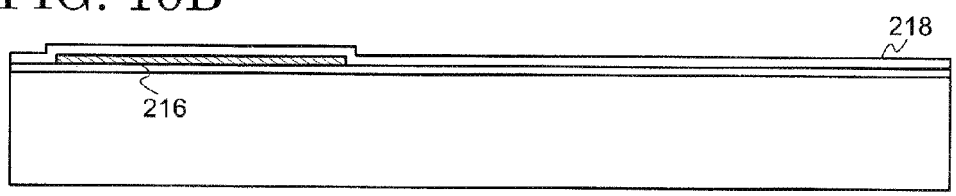
Figure 10C:
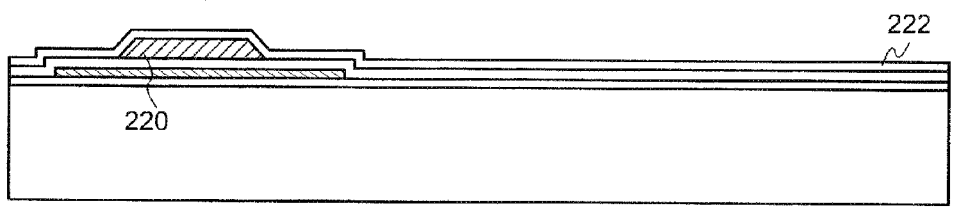

Next, the semiconductor layer 216 is formed over the base film 214 (FIG. 10B). For example, the semiconductor layer 216 can be obtained by forming a semiconductor film with a material exhibiting semiconductor properties, such as silicon or an oxide, followed by processing with etching. Morphology of the semiconductor layer 216 is not limited, and the semiconductor layer 216 may have a variety of morphology such as amorphous, polycrystalline, or microcrystalline morphology. The gate insulating film 218 is formed over the semiconductor layer 216 by using an inorganic insulator such as silicon oxide and aluminum oxide.

The gate electrode 220 is formed over the gate insulating film 218. The gate electrode 220 is formed with a metal, an alloy, or a semiconductor doped with an impurity at a high concentration. The gate electrode 220 can be formed by using one layer or by stacking a plurality of layers including these materials. The protection film is formed so as to cover the gate electrode 220. An insulating film structured with an inorganic insulator such as silicon oxide, silicon nitride, silicon nitride oxide, and silicon oxynitride or a stacked film thereof can be used for the protection film 220.

Figure 10D:
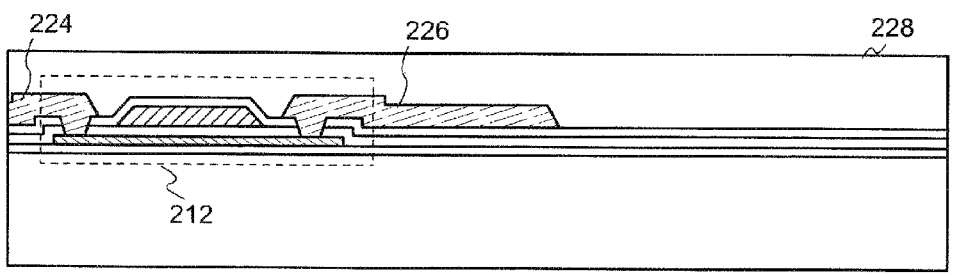

Next, an opening reaching the semiconductor film 216 is formed in the gate insulating film 218 and the protection film 222, and the source electrode 224 and the drain electrode 226 are formed so as to cover the opening (FIG. 10D). The source electrode 224 and the drain electrode 226 may have a single layer structure of a metal or an alloy or a structure in which different metal layers are stacked. Up to this stage, the basic structure of the transistor 212 is obtained. After that, the interlayer insulating film 228 is formed. The interlayer insulating film 228 can be formed with an inorganic insulator or an organic insulator (e.g., a resin). Since the interlayer insulating film 228 also functions as a leveling film to absorb depressions and projections caused by the transistor 212, a resin such as a polyimide, a polyamide, an acrylic resin, and an epoxy resin, which is capable of forming a film with a wet process, can be used.

Figure 10E:
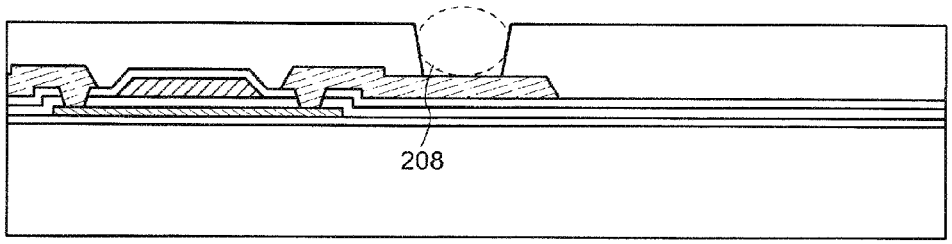

Next, the opening portion 208 reaching the drain electrode 226 is formed in the interlayer insulating film 228 (FIG. 10E). As described above, the electrical connection of the transistor 212 to the light-emitting element 201 is carried out by using this opening portion 208.

Figure 11A:
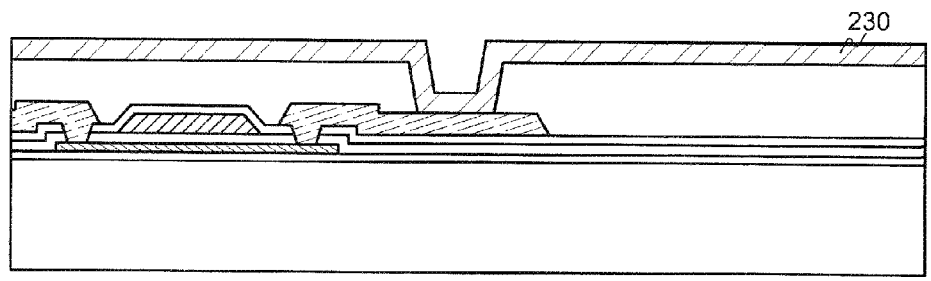
FIG. 11A to FIG. 11D are drawings showing a manufacturing method of a display device of an embodiment of the present invention.

Next, the first electrode 230 is formed over the interlayer insulating film 228 so as to cover the opening portion 208 (FIG. 11A). In the present embodiment, a structure (top-emission structure) is shown in which light emission from the light-emitting element 201 is obtained through the opposing substrate 242. However, a structure can be employed in which the light-emission is obtained through the substrate 210. When the top-emission structure of the present embodiment is adopted, a structure is preferred in which the first electrode 230 has a high reflectance with respect to visible light. Specifically, a metal such as silver and aluminum or an alloy thereof is represented. Alternatively, a structure in which a transparent conductive oxide such as ITO is stacked over a metal such as silver and aluminum is given. Alternatively, a structure in which a metal is sandwiched between by a transparent conductive oxide can be used. When the light-emitting element 201 is a bottom-emission type, a transparent conductive oxide may be used for the first electrode 230.

Figure 11B:
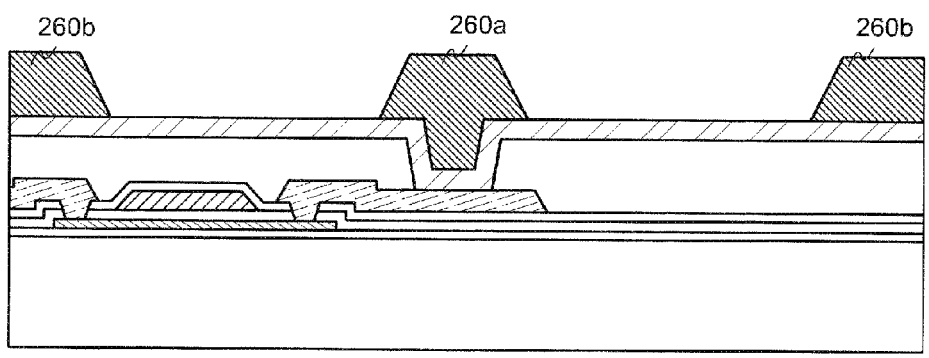

After that, the insulating films 260a and 260b are formed over the first electrode by using an insulator such as a resin (FIG. 11B). As described above, the insulating film 260a is formed so as to cover the opening portion 208 and protrude from the opening portion 208 in the directions parallel and perpendicular to the surface of the substrate 210. On the other hand, the insulating film 206b functions as the partition wall electrically insulating the adjacent pixels. The sidewalls of the insulating films 206a and 206b are inclined from the surface of the substrate 210 and have a taper shape. The taper shape prevents various layers formed over the insulating films 260a and 260b from being disconnected due to the shapes of the lower layers and also prevents their thicknesses from being widely varied.

Figure 11C:
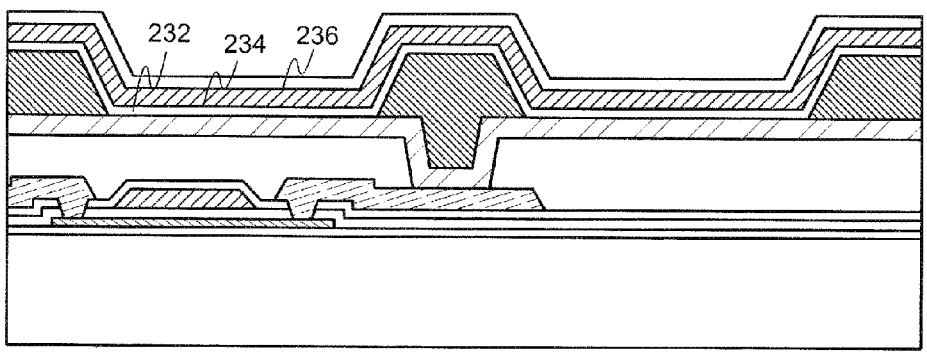

The organic layer 232 is formed over the insulating films 206a and 206b and the first electrode 230 (FIG. 11C). At least a part of the organic layer 232 is formed with an organic material. Additionally, the organic layer 232 is not limited to having a single layer structure and may possess a multi-layer structure formed with a variety of layers such as a hole-injection layer, a hole-transporting layer, an emission layer, an electron-transporting layer, an electron-injection layer, and a carrier-blocking layer. The organic layer 232 may have a structure giving white emission. Alternatively, the organic layer 232 may be fabricated by forming emission layers of red, blue, and green colors in the respective pixels 116. When the organic layer 232 undergoes white emission, all of the pixels 116 are formed with the organic layer 232 having a common structure, and color filters 250 different in absorption property between pixels 116 are arranged, thereby supplying the display device 100 capable of full-color display.

The second electrode 232 is formed over the organic layer 232 (FIG. 11C). The second electrode 234 is formed so as to extend over the plurality of pixels 116 and also functions as a common electrode. Since the light-emitting element 201 of the pixel 116 is a top-emission type, the second electrode 234 is formed so as to have a transmitting property with respect to the light obtained in the organic layer 232. For example, a metal having a low work function (e.g., Group 2 metal of the periodic table) or a transparent conductive oxide is employed. As an example of the former, magnesium and an alloy of magnesium and silver are represented and deposited at a thickness (approximately 1 nm to 10 nm) allowing visible light to pass therethrough. The second electrode 234 may be formed as a stacked structure in which a transparent conductive oxide is formed over a metal with a low work function.

The protection film 236 for protecting the light-emitting element 201 from ambient water and the like is formed over the second electrode 234 (FIG. 11C). The protection film 236 is formed by using an inorganic insulator such as silicon nitride. Note that the protection film 236 may not be provided.

Figure 11D:
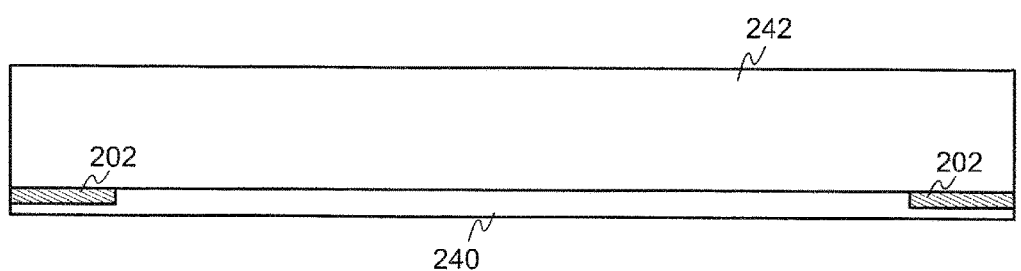

The light-shielding film 202 is formed over the opposing substrate 242 by using a metal material with a low reflectance, such as chromium and titanium or a resin including a coloring material of black or a similar color, and then the protection film 240 for protecting the light-shielding film 202 is formed (FIG. 11D). The protection film 240 is formed with a resin or an inorganic insulator. Note that the protection film is not necessarily required, and its formation may be omitted. Furthermore, a color filter 250 may be formed between the protection film 240 and the opposing substrate 242 (see FIG. 8B), by which emission color from the organic layer 232 can be controlled.

After that, the substrate 210 and the opposing substrate 242 are bonded to each other with the filler 238 functioning as an adhesive and a protective material so that the light-emitting element 201 and the light-shielding film 202 are sandwiched (see FIG. 2B). As the filler 238, a resin such as a polyimide, a polyamide, an acrylic resin, and an epoxy resin may be used. A spacer may be disposed between the substrate 210 and the opposing substrate 242 to maintain the distance therebetween. Such a spacer may be mixed into the filler or may be formed over the substrate with a resin. Moreover, a desiccant may be mixed in the filer 238. Note that, when sufficient sealing can be accomplished in the periphery portion of the substrate 210 and the opposing substrate 242, the filler may not be used and a hollow sealing may be applied.

Through the aforementioned process, the display device having the pixel 116 shown in FIG. 2B can be manufactured. Note that the formation of the sealing film 280 and the polarizing plate 290 over the structure of FIG. 11C allows the fabrication of the display device including the pixel 400 shown in FIG. 8A.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is properly understood that another effect different from that provided by the modes of the aforementioned embodiments is achieved by the present invention if the effect is obvious from the description in the specification or readily conceived by persons ordinarily skilled in the art.

What is claimed is:

1. A manufacturing method of a display device, the method comprising the steps of:
    forming a conductive film over a substrate;
    forming an interlayer insulating film over the conductive film;
    forming a first opening portion in the interlayer insulating film so as to expose the conductive film;
    forming a first electrode over the interlayer insulating film, the first electrode being electrically connected to the conductive film;
    forming a first insulating film over the first electrode, the first insulating film covering the first opening portion;
    forming a second insulating film at a peripheral portion of the first electrode;
    forming an organic layer over the first insulating film and the second insulating film; and
    forming a second electrode over the organic layer,
    wherein the organic layer is formed so that a first region of the organic layer in contact with the first electrode surrounds the first insulating film, and an area defined by a periphery of the first region has at least two symmetry axes in a direction parallel to a surface of the substrate.

2. A display device comprising:
    a substrate; and
    a plurality of pixels over the substrate, the plurality of pixels each comprising:
        a transistor;
        an interlayer insulating film over the transistor;
        a first electrode over the interlayer insulating film;
        a first insulating film over the first electrode;
        an organic layer over the first electrode and the first insulating film; and
        a second electrode over the organic layer,
    wherein, in each of the plurality of pixels:
    the interlayer insulating film has a first opening portion;
    the first electrode is electrically connected to the transistor in the first opening portion;
    the first insulating film covers the first opening portion;
    a first region of the organic layer in contact with the first electrode surrounds the first insulating film; and
    an area defined by a periphery of the first region has at least two symmetry axes in a direction parallel to a surface of the substrate.

3. The display device according to claim 2,
    wherein a side surface of the first insulating film is in contact with the organic layer, and
    wherein the side surface of the first insulating film is inclined from the surface of the substrate at an angle larger than 0° and smaller than 90°.

4. The display device according to claim 2,
    wherein the area defined by the periphery of the first region is a circular shape, an ellipse shape, a square shape, a rectangular shape, or a diamond shape.

5. The display device according to claim 2,
    wherein the first insulating film protrudes from the first opening portion in a parallel direction and a perpendicular direction to the surface of the substrate.

6. The display device according to claim 2,
    wherein a cross section of the first opening portion parallel to the surface of the substrate is a circular shape, a square shape, or a rectangular shape.

7. The display device according to claim 2,
    wherein a center of the area defined by the periphery of the first region overlaps with the first opening portion.

8. The display device according to claim 2,
    wherein a center of the area defined by the periphery of the first region overlaps with the first insulating film.

9. The display device according to claim 2, further comprising a light-shielding film over a cathode, the light-shielding film having a second opening portion.

10. The display device according to claim 2,
    wherein the first opening portion has a sidewall inclined from the surface of the substrate.

11. A display device comprising:
    a substrate; and
    a plurality of pixels over the substrate, the plurality of pixels each comprising:
        a conductive film;
        an interlayer insulating film over the conductive film;
        a first electrode over the interlayer insulating film;
        a first insulating film over the first electrode;

an organic layer over the first electrode and the first insulating film; and a second electrode over the organic layer; and a second insulating film surrounding the first electrode so as to electrically separate adjacent pixels from each other, wherein, in each of the plurality of pixels:

the interlayer insulating film has a first opening portion overlapping with the conductive film;

the first electrode is electrically connected to the conductive film in the first opening portion;

the first insulating film covers the first opening portion;

a first region of the organic layer in contact with the first electrode surrounds the first insulating film; and an area defined by a periphery of the first region has at least two symmetry axes in a direction parallel to a surface of the substrate.

12. The display device according to claim 11, wherein a side surface of the first insulating film is in contact with the organic layer, and wherein the side surface of the first insulating film is inclined from the surface of the substrate at an angle larger than 0° and smaller than 90°.

13. The display device according to claim 11, wherein the first insulating film protrudes from the first opening portion in a parallel direction and a perpendicular direction to the surface of the substrate.

14. The display device according to claim 11, wherein a cross section of the first opening portion parallel to the surface of the substrate is a circular shape, a square shape, or a rectangular shape.

15. The display device according to claim 11, wherein a center of the area defined by the periphery of the first region overlaps with the first opening portion.

16. The display device according to claim 11, wherein a center of the area defined by the periphery of the first region overlaps with the first insulating film.

17. The display device according to claim 11, further comprising a light-shielding film over a cathode, the light-shielding film having a second opening portion.

18. The display device according to claim 11, wherein the first opening portion has a sidewall inclined from the surface of the substrate.

* * * * *